United States Patent [19]

Kasperkovitz

[11] Patent Number: 4,509,205
[45] Date of Patent: Apr. 2, 1985

[54] RADIO RECEIVER COMPRISING A FREQUENCY LOCKED LOOP WITH AUDIO FREQUENCY FEEDBACK, AND A MUTING CIRCUIT

[75] Inventor: Wolfdietrich G. Kasperkovitz, Eindhoven, Netherlands

[73] Assignee: U.S. Philips Corporation, New York, N.Y.

[21] Appl. No.: 521,812

[22] Filed: Aug. 10, 1983

Related U.S. Application Data

[63] Continuation of Ser. No. 183,553, Sep. 2, 1980, Pat. No. 4,426,735.

[30] Foreign Application Priority Data

Sep. 4, 1979 [NL] Netherlands ............... 7906602

[51] Int. Cl.³ .................. H04B 1/10; H04B 1/26
[52] U.S. Cl. .................. 455/194; 455/212; 455/256; 455/264; 455/265
[58] Field of Search ............ 455/258, 263, 264, 205, 455/212, 213, 218, 222, 194, 256, 265

[56] References Cited

U.S. PATENT DOCUMENTS

| | | | |
|---|---|---|---|
| 2,177,713 | 10/1939 | Granqvist | 455/256 |
| 2,831,106 | 4/1958 | Clark | 455/222 |
| 3,619,492 | 11/1971 | Evans | 455/194 |
| 4,087,756 | 5/1978 | Rogers, Jr. | 455/213 |
| 4,232,393 | 11/1980 | Kumaoka et al. | 455/194 |

Primary Examiner—Marc E. Bookbinder
Attorney, Agent, or Firm—Thomas A. Briody; William J. Streeter

[57] ABSTRACT

Radio-receiver having a frequency-locked loop which comprises, arranged one after the other, a tunable voltage-controlled oscillator, a mixer stage, a filtering element, as well as a frequency-voltage converter which is connected to the tunable voltage-controlled oscillator, several stable tunings being possible for each transmitter. An unambiguous selection is made from these stable tunings of a tuning to a desired station by muting the radio receiver in the other stable tuning frequency ranges. To this end the radio receiver according to the invention comprises a muting circuit as well as a control circuit for the muting circuit in which use is made of a further frequency voltage converter comprising an all-pass frequency-dependent 180° phase shifting network, a phase detector and a limiter. By adjusting the muting circuit of the radio receiver to the quiescent condition only in the desired tuning range and by activating it outside this range, a suppression of interstation noise is obtained at the same time.

1 Claim, 7 Drawing Figures

RADIO RECEIVER COMPRISING A FREQUENCY LOCKED LOOP WITH AUDIO FREQUENCY FEEDBACK, AND A MUTING CIRCUIT

This is a continuation of application Ser. No. 183,553, filed Sept. 2, 1980, now U.S. Pat. No. 4,426,735.

BACKGROUND OF THE INVENTION

The invention relates to a radio receiver comprising a frequency-locked loop, which includes, arranged one after the other, a voltage-controlled oscillator having an input for the tuning voltage, a mixer stage connected to an aerial input, a filtering member and a frequency-voltage converter connected to the voltage controlled oscillator.

Such a radio receiver is described in the article "Ein Neues Empfangsprinzip für FM-Empfänger mit integrierter Schaltung", by G. G. Gassmann, published in "Radio Mentor" No. 6, 1966, pages 512–518.

The known radio receiver is suitable for construction in integrated form because a low intermediate-frequency is used. However, the use of such a low intermediate frequency provides the possibility of several stable tuning states for each transmitter. The realization of the measure described in the above-mentioned article to effect a frequency jump by means of a bistable multivibrator so that a tuning lock to an unwanted stable tuning state is skipped when tuning from one station to another station, has several drawbacks. It must, for example, be avoided that a frequency jump is initiated from an unwanted stable tuning state; the frequency jump must be made in the tuning direction; the switching operations of the bistable multivibrator should not be audible and there should be no noticeable difference between the setting and resetting voltages of the bistable multivibrator.

SUMMARY OF THE INVENTION

The invention has for its object to provide a radio receiver of the type described in the opening paragraph which is suitable for construction in integrated form, which has an unambiguous tuning behavior and an automatic suppression of interstation noise.

According to the invention, such a radio receiver is therefore characterized in that an output of the filtering member is coupled to a first input of a first phase detector and also, via an all-pass frequency-dependent 180° phase shifting network, to a second input of the first phase detector, said all-pass frequency-dependent 180° phase shifting network being constructed to shift the phase of a signal passing therethrough by an amount which depends on the frequency of said signal and is 180° for a predetermined value of said frequency, this first phase detector being coupled via a first limiter to a control input of a muting circuit for blocking an audio signal unless the receiver is substantially correctly tuned to a broadcast transmission.

The feedback in the frequency locked loop and the frequency conversion to a lower intermediate frequency causes a stable, unwanted secondary tuning state in addition to the correct tuning state. When the measure according to the invention is used, tuning to the stable, unwanted secondary tuning frequency is still possible, but the accompanying interference effects are suppressed. The limits of the correct tuning range are adjusted by means of the said all-pass frequency-dependent 180° phase shifting network, the first phase detector and the first limiter coupled thereto. When these limits are exceeded within the correct tuning range, the muting circuit becomes operative. As the sound signal between the correct tuning ranges of the transmitters is suppressed, the user is unaware of the fact that the unwanted secondary tuning frequencies are pulled in and being locked to. The user will continue tuning until the desired correct stable tuning range is reached. Furthermore, the interstation noise is suppressed.

A preferred embodiment of a radio receiver according to the invention is characterized in that the frequency-voltage converter comprises a second phase detector having first and second inputs, the first input being connected to the filtering element and also, via a first frequency-dependent 90° phase shifter, to the second input, and that the said all-pass frequency-dependent 180° phase shifting network comprises a second frequency-dependent 90° phase shifter which is arranged in cascade with the said first frequency-dependent 90° phase shifter and is connected to the second input of the first phase detector, both frequency-dependent 90° phase shifters being constructed to shift the phase of a signal passing therethrough by an amount which depends on the frequency of said signal and is 90° for a predetermined value of said frequency.

When this measure is used, an advantageous realization of the radio receiver according to the invention becomes possible owing to the fact that the first frequency-dependent 90° phase shifter is used on the one hand as a frequency-depending phase shifter in the frequency-voltage converter and on the other hand as a preliminary stage for the second 90° phase shifter of the all-pass frequency-dependent 180° phase shifting network.

A further preferred embodiment of such a radio receiver is characterized in that the first input of the first phase detector is coupled to the filtering element via a second limiter and that the second input of the first phase detector is connected to an output of the all-pass frequency-dependent 180° phase shifting network via a third limiter.

When this measure is used the muting circuit is controlled independent of the amplitude of the received aerial signal.

Another preferred embodiment of a radio receiver according to the invention is characterized in that the phase detector comprises a multiplying stage and a low-pass-filter having a bandwidth to the order of magnitude of 1 Hz.

When this measure is used it is prevented for frequency-modulated signals that on the one hand the muting circuit is switched in an audio-frequency rhythm and on the other hand that the muting circuit is switched off too slowly, so that transmitters are skipped during tuning.

A still further preferred embodiment of such a radio receiver according to the invention is characterized in that the frequency-voltage converter is connected to the voltage-controlled oscillator via a first amplifier-limiter.

When this measure is used, the loop gain and the size of the effective range of action of the automatic frequency control can be adjusted in a proper relationship with respect to the range in which the tuning circuit is in the switched-off condition, by means of a proper choice of the limiting amplitude of the first amplifier limiter. When the receiver is tuned to the edge of the correct tuning range the at least partially limiting action of the first amplifier limiter produces a distortion of the sound signal, which is an indication for the user that a more optimal tuning is possible.

Yet another preferred embodiment of a radio receiver according to the invention is characterized in that the second phase detector comprises a multiplier stage which is connected to the two inputs and a low-pass filter coupled to this stage, this low-pass filter which has a bandwidth of the same width as the audible audio frequency range and is connected to a signal processing section of the radio receiver by way of the muting circuit.

When this measure is used the frequency-voltage converter does not only function as a control voltage generating circuit for the automatic frequency control but also as a frequency demodulator.

A further preferred embodiment of such a radio receiver is characterized in that the filtering element is connected via a second amplifier limiter on the one hand to the first input of the second phase detector and on the other hand to the second limiter.

When this measure is used a square-law amplification of AM noise from FM signals which occurs, for example, with conventional FM square-law demodulators is avoided. As in this receiver the average noise level outside tuning is equal to the average signal level in the case of correct tuning, noise peaks which are produced in the prior art receiver, described in the opening paragraph, at fluctuations of the noise level around the signal level are prevented.

In addition, small signals are amplified linearly when the limiting amplitude of this second amplifier limiter is chosen properly, so that the bandwidth of the loop is narrower for small noise signals than for the stronger, desired signals at which limitation occurs, so that high-frequency noise interference is less audible.

Another preferred embodiment of a radio receiver according to the invention is characterized in that an input of the muting circuit is coupled to a noise source circuit for applying a noise signal to an audio signal processing section of the receiver when the muting circuit is activated.

When this measure is used, an artificial, acceptable noise signal is generated when a transmission is not correctly tuned to which is an indication for the user that the FM-receiver is in operation when it is tuned between two transmitters.

DESCRIPTION OF THE DRAWING

The invention will now be further explained by way of non-limitative example with reference to the Figures shown in the accompanying drawing.

Herein.

DESCRIPTION OF THE PREFERRED EMBODIMENTS

Figure 1:
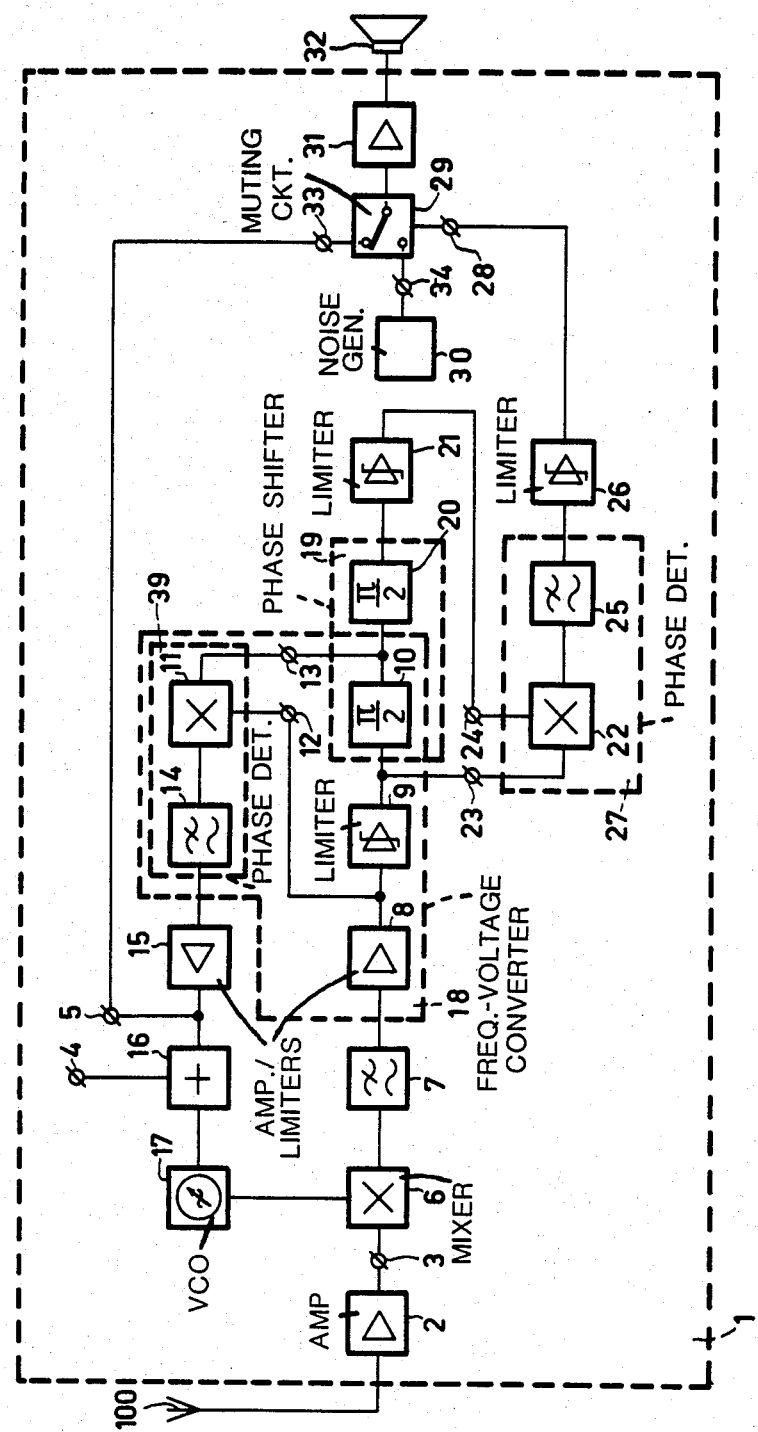
FIG. 1 shows a FM-receiver according to the invention.

FIG. 1 shows a FM-receiver 1 according to the invention, one side of which is connected to an aerial device 100 and the other end to a loudspeaker 32. The FM-receiver 1 comprises a frequency-locked loop 6 to 18, inclusive, having a signal input 3 which is coupled to the aerial device 100, via an input amplifier 2, and a control circuit 19 to 27, inclusive, one side of which is coupled in a manner to be described hereinafter to the frequency-locked loop 6 to 18, inclusive, the other side being coupled to a control input 28 of a muting circuit 29. The muting circuit 29 comprises first and second inputs 33 and 34, the first input 33 being coupled to a signal output 5 of the frequency-locked loop 6 to 18, inclusive, the second input being coupled to a noise source 30. An output of the muting circuit 29 is coupled to the loudspeaker 32 through an audio signal processing section 31. In the quiescent state, the first input 33 is connected to the output of the muting circuit 29, in the operating condition, the second input 34 is connected to this muting circuit output. The frequency-locked loop 6 to 18, inclusive, comprises, arranged one after the other, a mixer stage 6 which is connected to the signal input 3, a low-pass filter 7, a frequency-voltage converter 18, a first amplifier limiter 15, an adder circuit 16 and a voltage controlled oscillator 17 which is connected to the mixer stage 6. The junction point between the first amplifier limiter 15 and the adder circuit 16 is connected to the signal output 5 of the frequency-locked loop 6 to 18, inclusive. The adder circuit 16 has also a tuning voltage input 4 and adds the tuning voltage applied thereto to the output voltage of the first amplifier limiter 15. The frequency-voltage converter 18 comprises a second amplifier limiter 8 connected to the low-pass filter 7, an output of which being coupled to a first input 12 of a second phase detector 39 and also to a second input 13 of the second phase detector 39 by way of a cascade arrangement of a second limiter 9 and a first frequency 90° phase shifter 10. This second phase detector 39 comprises a cascade arrangement of a mixer stage 11, connected to the inputs 12 and 13, and a low-pass filter 14, connected to the first amplifier limiter 15.

The control circuit 19 to 27 inclusive comprises an all-pass frequency-dependent 180° phase shifter 19 which, by way of a third limiter 21, is coupled to a second input 24 of a first phase detector 27. A first input 23 of the phase detector 27 is coupled to an output of the second limiter 9 of the frequency-voltage converter 18. An output of the first phase detector 27 is connected to the control input 28 of the muting circuit 29 by way of a first limiter 26.

The all-pass frequency-dependent 180° phase shifter 19 comprises a second frequency-dependent 90° phase shifter 20, which is connected between the first 90° phase shifter 10 of the frequency voltage converter 18 and the third limiter 21. The two cascaded frequency-dependent 90° phase shifters 10 and 20 jointly operate as the all-pass frequency-dependent 180° phase shifter, both frequency-dependent 90° phase shifters 10, 20 being constructed to shift the phase of a signal passing therethrough by an amount which depends on the frequency of said signal and is 90° for a predetermined value of said frequency. The first phase detector 27 comprises a cascade arrangement of a mixer stage 22, connected to the two inputs 23 and 24 and a low-pass filter 25, connected to the first limiter 26.

The input amplifier 2 amplifies the aerial signal which has the carrier frequency $f_z$ and applies it to the mixer stage 6. In the mixer stage 6 this aerial signal is multiplied by the signal of the voltage-controlled oscillator 17 having the frequency $f_{vco}$, whereafter the desired mixed product having the frequency $f_z-f_{vco}$ is selected by means of the low-pass filter 7. Unwanted mixed products, for example caused by neighboring transmitters, are suppressed by the low-pass filter 7. In a practical embodiment, the 3 dB-bandwidth of the low-pass filter 7 is 100 kHz.

The second amplifier limiter 8 amplifies weak input signals (for example noise signals or signals which were not fully suppressed on the edge of the low-pass filter 7) linearly and acts as a limiter for strong input signals which pass the low-pass filter unattenuated. The output signal of the second amplifier limiter 8 is applied to the first input 12 of the mixer stage 11 and also to the second limiter 9, where the amplitude of this output signal is limited. In the first 90° phase shifter 10, a frequency-dependent phase shift is effected, signals having a frequency $f_1$ being submitted to a 90° phase shift. The frequency $f_1$, being the characteristic frequency of the 90° phase shifter 10, was chosen equal to 60 kHz in a practical embodiment.

In the mixer stage 11, the output signals of the 90° phase shifter 10 are multiplied by the outputs of the second amplifier limiter 8, and the products thus obtained have an amplitude which is proportional to the phase difference between the signals applied to the two inputs 12 and 13 of the mixer stage 11, as well as to the amplitudes thereof. The noise behavior of the frequency-voltage converter 18 is consequently more advantageous than with conventional FM square-law demodulators, in which both signals to be multiplied are limited. Such conventional FM square-law demodulators operate in a square-law manner also for small noise signals and consequently amplify the noise components located in the pass-band of the low-pass filter 7 to a disturbing degree.

The low-pass filter 14 selects the audio frequency mixed product from the mixed product obtained at the output of the mixer stage 11. The low-pass characteristic of this low-pass filter 14 determines the slope and the cutt-off frequency of the loop gain characteristic and consequently the frequency range within which a feedback may occur in the loop. The bandwidth of this low-pass filter 14, also called loop filter, is 15 kHz in a practical embodiment.

Figure 2:
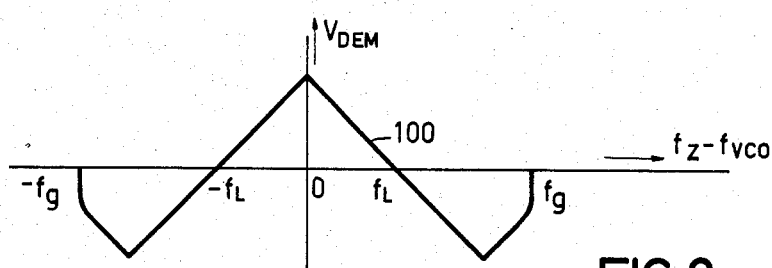
FIGS. 2 to 5 inclusive show the idealized variation of the output voltage of the frequency-voltage converter, the first amplifier limiter, the first phase-detector and the first limiter, coupled to the first phase detector, respectively, of the receiver according to the invention as a function of a standardized unmodulated tuning frequency at one given level of the aerial signal.

For a detailed description of the operation of the frequency-voltage converter 18, reference is made to FIG. 2 in which the curve 100 shows the idealized variation of the output voltage $V_{DEM}$ of this frequency-voltage converter 18 as a function of the difference frequency $f_z-f_{vco}$, which is used as the standardized tuning frequency, at one given level of an unmodulated aerial signal having the transmitter frequency $f_z$.

The curve 100 is symmetrical with respect to the point at which $f_z=f_{vco}$ as the result of the conversion, carried out in the mixer stage 6, to a low base-band. Furthermore, at the frequencies $f_1$ and $-f_1$ of the standardized tuning frequency $f_z-f_{vco}$, a 90° phase shift is obtained between the signals at the two inputs 12 and 13 of the second phase detector 39. $V_{DEM}$ is then equal to zero. If the frequency at which a signal having the level of the aerial signal is suppressed almost completely in the low-pass filter 7 is denoted $f_g$, then $V_{DEM}$ is equal to zero, also in these frequency ranges, at a standardized tuning frequency $f_z-f_{vco}$, which is above $f_g$ or below $-f_g$.

At standardized tuning frequencies $f_z-f_{vco}$ at which a partial suppression of the aerial signal on the edge of the low-pass filter 7 occurs, the aerial signal thus suppressed to a considerable extent, may be smaller than the noise signal generated by the mixer stage 6 and present in the pass-band of the low-pass filter 7. Owing to the linear amplification in the amplifier-limiter 8, the voltage $V_{DEM}$ is, at these small signal amplitudes, independent of the frequency at which they occur. This causes the average noise level to coincide, after demodulation in the frequency-voltage converter 18, with the average level of correct tuning in $f_1$. This accomplishes that weak aerial signals which are occasionally drowned in noise do not result in annoying pulse-shaped interferences, as sudden voltage transients between the noise level and the signal level do not occur.

The output signal $V_{DEM}$ of the frequency-voltage converter 18 is applied to the first amplifier-limiter 15, in which a linear amplification of the output signal $V_{DEM}$ is effected up to a predetermined maximum signal level. In the relevant Figure this maximum signal level is inter alia attained at a standardized tuning frequency $f_z-f_{vco}$ of $0.5 f_1$ and $1.5 f_1$. The signals above the maximum signal level are limited.

Figure 3:
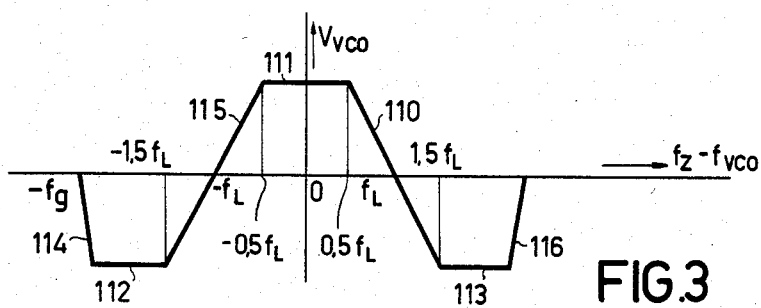

For a detailed description of the operation of the limiter 15, reference is made to FIG. 3. In this FIG. 3 curves 110 to 116 inclusive show the idealized variation of the output voltage $V_{VCO}$ of the amplifier-limiter 15 as a function of the difference frequency $f_z-f_{vco}$, which is used as the standardized tuning frequency, for a predetermined level of an unmodulated aerial signal having the transmitter frequency $f_z$.

The amplifier-limiter 15 is in the limiting mode in the ranges indicated by curves 111 to 113 inclusive of the standardized tuning frequency $f_z-f_{vco}$. In these ranges, the holding ranges described hereinafter, the loop is indeed keyed, but $V_{VCO}$ and, consequently, the oscillator frequency $f_{vco}$ remains constant. A linear amplification of $V_{DEM}$ is carried out in the ranges indicated by curves 110 and 114 to 116 inclusive. A positive feedback in the frequency-locked loop 6 to 18 inclusive is, however, carried out in the ranges indicated by the curves 115 and 116. In these frequency ranges the oscillator frequency will vary suddenly.

A negative feedback occurs in the ranges indicated by the curves 114 to 116. In these ranges a stable tuning is effected, that is to say a locking of the frequency-locked loop. An unwanted secondary tuning, which is suppressed in accordance with the invention in the manner to be described hereinafter, is effected on the curve 114. The curve 115 indicates the correct tuning range or the lock-in range of the voltage-controlled oscillator 17.

A control voltage for the muting circuit is obtained by means of the control circuit 19 to 27, inclusive, shown in FIG. 1 and comprising the all-pass frequency-dependent 180° phase shifting network 19, the third limiter 21, the phase detector 27 and the first limiter 26.

Figure 4:
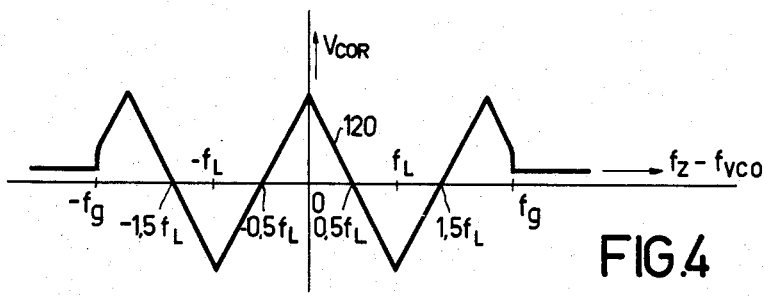
Figure 5:
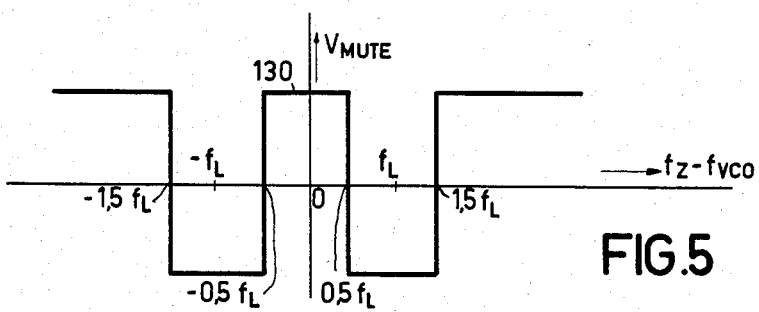

To explain the operation of this control circuit 19 to 27 inclusive, reference is made to the FIGS. 4 and 5 in which the output voltage $V_{COR}$ of the phase detector 27 and the control voltage $V_{MUTE}$, respectively, used at the output of the limiter 26 as a function of the difference frequency $f_z-f_{vco}$ as the standardized tuning frequency are shown in an idealized manner at one given level of an unmodulated aerial signal having the transmitter frequency $f_z$.

The variation of $V_{COR}$, shown in FIG. 4 by means of curve 120, is obtained as a result of the fact that the two signals applied to the inputs 23 and 24 of the mixer stage 22 have both been limited and have a mutual phase difference which was produced in the all-phase frequency-dependent 180° phase shifting network. The characteristic frequency of the second 90° phase shifter 20 has been set equal to that of the first 90° phase shifter 10 ($f_1 = 60$ kHz), so that at standardized tuning frequencies $f_z-f_{vco}$ of 0; 0.5 $f_1$; $f_1$; 1.5 $f_1$; $-0.5$ $f_1$; $-f_1$ and $-1.5$ $f_1$ phase shifts of 0; 90°; 180°; 270°; $-90°$; $-180°$ and $-270°$, respectively, are obtained. On the one hand, the bandwidth of the low-pass filter 25 should not be chosen too wide to prevent the tuning circuit from being continuously switched on and off in an audio frequency rhythm on tuning in the region of 0.5 $f_1$ and 1.5 $f_1$ and, on the other hand, should not be chosen too small to prevent the muting circuit 29 from being switched off too slowly on tuning, which might cause transmitters to be skipped. A practical value for this bandwidth is 1 Hz.

The idealized variation of $V_{MUTE}$, shown in FIG. 5 by means of curve 130, is obtained by means of an infinite gain of $V_{COR}$ in the first limiter 26. The output voltage $V_{MUTE}$ of the limiter 26, that is to say the control voltage for the muting circuit 29, varies suddenly between two discrete values. Change-overs are effected at the values $-1.5$ $f_1$; $-0.5$ $f_1$; 0.5 $f_1$ and 1.5 $f_1$ of the standardized tuning frequency $f_z-f_{vco}$.

When the tuning circuit 29 is energized at a positive value of $V_{MUTE}$ and switched to the quiescent condition at a negative value of $V_{MUTE}$, the signal output 5 of the frequency-locked loop is decoupled from the signal processing section 31 and the noise source 30 is coupled to this signal processing section 31 at a standardized tuning frequency $f_z-f_{vco}$ below $-1.5,f_1$ between 0.5 $f_1$ and 0.5 $f_1$ and above 1.5 $f_1$. The loudspeaker 32 consequently furnishes the user, when the receiver is not yet tuned to the desired station, an acoustic indication of the fact that the FM-receiver is in operation, while any tuning to secondary stations in the range shown in FIG. 3 by means of curve 114, is suppressed. The thermal noise of a resistor amplified by an amplifier may function as the noise source.

At a standardized tuning frequency $f_z-f_{vco}$ between $-1.5$ $f_1$, and $-0.5$ $f_1$ and between 0.5 $f_1$ and 1.5 $f_1$ the signal output 5 of the frequency-locked loop is through connected to the signal processing section 31 and reproduction of audio frequency signals is effected with the loudspeaker 32. As mentioned hereinbefore, the loop is fed back positively in the frequency range between $-0.5$ $f_1$ and $-1.5$ $f_1$, so that this range is passed in one jump and a stable tuning is only possible in the correct tuning range between 0.5 $f_1$ and 1.5 $f_1$, the tuning circuit 29 being in the quiescent condition.

Figure 6:
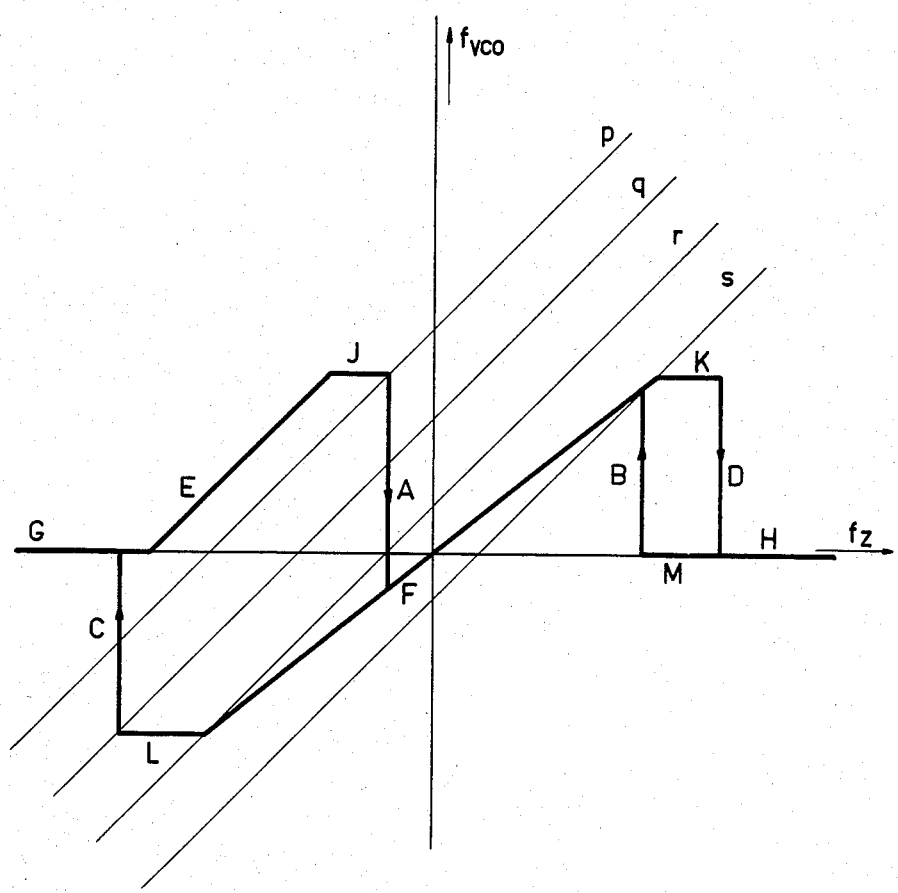
FIG. 6 shows the tuning behaviour of the receiver according to the invention.

FIG. 6 shows the tuning behavior of the FM-receiver according to the invention. For simplicity, the frequency $f_{vco}$ of the voltage-controlled oscillator 17 is shown as a function of an unmodulated aerial signal having a continuously varying transmitter frequency $f_z$ and a constant amplitude.

The lines p, q, r and s indicate the points at which the standardized tuning frequency $f_z-f_{vco}$ assumes the respective values $-1.5$ $f_1$, $-0.5$ $f_1$, 0.5 $f_1$ and 1.5 $f_1$. The tuning circuit 29 is in the quiescent condition at a standardized tuning frequency $f_z-f_{vco}$ between the lines p and q and between the lines r and s, outside these areas the muting circuit 29 is operative.

In the range where $f_z-f_{vco}$ is smaller than $-1.5$ $f_1$, trajectory G is first passed through at an increasing $f_z$. The frequencylocked loop is unlocked here and the voltage-controlled oscillator 17 runs free. Thereafter, when $f_z-f_{vco} = -1.5$ $f_1$ trajectory E is reached where the frequency-locked loop is locked and the frequency $f_{vco}$ of the voltage-controlled oscillator 17 is pulled-in by the transmitter frequency $f_z$. The trajectory E indicates the range of the stable secondary tuning, which is shown in FIG. 3 by means of the curve 114.

Trajectory J is passed through at a further increase of $f_z$. In this range limiter 15 is performing its limiting action and the frequency $f_{vco}$ remains at a constant value in spite of an increasing $f_z$. The trajectory J corresponds with the holding range indicated in FIG. 3 by means of the curve 112. As the muting circuit 29 is active when the trajectories G, E and J are passed through, tuning through this frequency range is mute, only the noise of the noise source 30, which is an acoustic indication for the tuning process, being reproduced.

The trajectory J is followed, at an increasing $f_z$, by trajectory A where a positive feedback is effected in the frequency-locked loop. This causes the frequency $f_{vco}$ to decrease suddenly until the frequency-locked loop is locked. During this sudden decrease of $f_{vco}$, the sub-trajectory between the lines p and q is passed through. As the muting circuit 29 is switched off with a certain inertia owing to the narrow bandwidth of the low-pass filter 25, the muting circuit 29 remains active also during this frequency jump through the sub-trajectory, so that the frequency jump does not become audible.

The locking of the frequency-locked loop is effected in the correct tuning range or pull-in range F. In FIG. 3, this range is indicated by curve 110. Here the oscillator frequency $f_{vco}$ follows the transmitter frequency $f_z$ across rather a wide range. In this way the demodulating function is combined with an automatic frequency control function.

The edge of the pull-in range is formed by the line s, where the limiter 15 starts its limiting operation and the oscillator frequency $f_{vco}$ remains constant at an increasing transmitter frequency $f_z$. The muting circuit 29 is activated here. Trajectory K is then passed through. This trajectory K corresponds with the range shown in FIG. 3 by the curve 113.

At a further increasing transmitter frequency $f_z$, the limiting action of the limiter 15 stops and a positive feedback occurs in the frequency-locked loop (see curve 116 in FIG. 3). As a result thereof the oscillator frequency $f_{vco}$ suddenly decreases until the loop is fully unlocked and the oscillator runs completely free. Trajectory D is then passed through.

At a still further increasing transmitter frequency $f_z$, the frequency-locked loop remains in the unlocked state and trajectory H is passed through. During tuning over the trajectories K, D and H, the muting circuit 29 is active and only the noise of the noise source 30, which is used as an acoustic tuning indication, is audible. In a practical embodiment it appeared that the pull-in range F was approximately 350 kHz.

Starting from the frequency range now reached, trajectory M is passed through after the trajectory H at a decreasing transmitter frequency $f_z$, locking of the frequency-locked loop being maintained in trajectory M. At a still further decreasing transmitter frequency $f_z$, the standardized tuning frequency $f_z-f_{vco}$ decreases until the value $f_g$ is reached and a positive feedback occurs in the loop (curve 116 of FIG. 3). At that moment the oscillator frequency $f_{vco}$ increases suddenly until the frequency-locked loop is locked. This frequency jump, shown by means of curve B, is not audible, as the muting circuit 29 is active in this frequency range.

Locking of the frequency-locked loop is effected in the correct tuning or pull-in range F, where a demodulation and an automatic frequency control may take place. The muting circuit 29 is then in the quiescent state. At a drecreasing transmitter frequency $f_z$, the edge of the pull-in range F is reached at the line r. The standardized tuning frequency $f_z-f_{vco}$ has here a value 0.5 $f_1$. The limiter 15 is actuated and trajectory L, corresponding with the range shown in FIG. 3 by curve 111, is passed through. The muting circuit 29 is now active.

At a further decrease of the transmitter frequency $f_z$, a positive feedback occurs in the frequency-locked loop at the line q, in response to which the oscillator frequency $f_{vco}$ suddenly increases until the loop is unlocked and the voltage-controlled oscillator 17 runs completely free. Trajectory C is then passed through. As was also the case for trajectory A, this frequency jump across the trajectory C passes the range between the lines p and q. Owing to the narrow bandwidth of the low-pass filter 25, the muting circuit 29 is switched off with a certain inertia, so that it remains active also during the passage through the last-mentioned range between p and q. This causes the frequency jump to be suppressed. At a still further decrease of the standardized tuning frequency $f_z-f_{vco}$, the frequency-locked loop remains in the unlocked state and the voltage-controlled oscillator 17 runs completely free.

It should be noted that it is alternatively possible to dimension the amplifier-limiter 15 and/or the control circuit 19 to 27 inclusive thus, that a limitation of $V_{VCO}$ occurs already before the muting circuit 29 is activated. The audible sound distortion by which this limitation is accompanied is an indication for the user that the receiver is tuned to an edge of the correct tuning range.

Figure 1A:
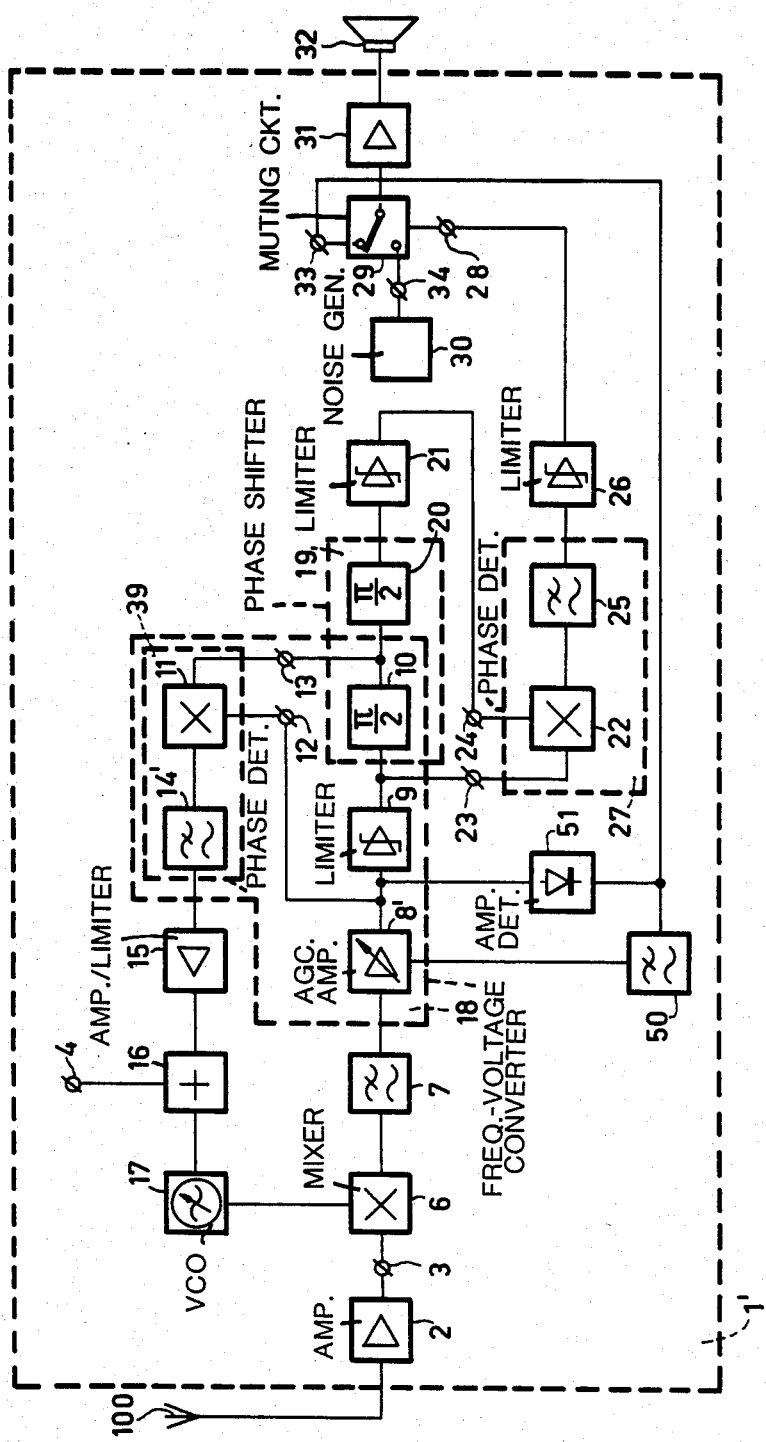
FIG. 1a shows an AM-receiver according to the invention.

FIG. 1a shows an AM-receiver 1' according to the invention in which the circuits which have the same function as the circuits of the FM-receiver 1 of FIG. 1 have been given the same reference numerals. The AM-receiver 1' differs from the FM-receiver 1 in that the demodulator function is not performed in the frequency-voltage converter 18 but in an amplitude detector 51, which is connected to the low-pass filter 7 by way of an AGC-amplifier 8'. An output of the amplitude detector 51 is connected to a control input of the AGC-amplifier 8' by way of an AGC-filter 50 and also to the input 33 of the muting circuit 29. The time constant of the AGC-filter 50 is approximately 0.1 second.

The frequency-voltage converter 18 functions only as a control generating circuit for an automatic frequency-control, which is realized by replacing the audio frequency low-pass filter 14 of the FM-receiver 1 by an automatic frequency control filter 41' having a time constant of approximately 1 second.

The ideal variation of the output voltage of the frequency-voltage converter 18, the first amplifier limiter 15, the first phase detector 27 and the first limiter 26 of this AM-receiver 1' according to the invention as a function of the standardized, unmodulated tuning frequency at one given level of the aerial signal as well as the tuning behaviour for unmodulated signals do of course not deviate from those of the FM-receiver 1 and is shown in the FIGS. 2 to 6 inclusive.

What is claimed is:

1. A radio receiver having a frequency locked loop, said loop including a voltage controlled oscillator having an input for a tuning voltage, a mixer stage coupled to the voltage controlled oscillator and also connected to an antenna, a filter coupled to an output of the mixer stage, and a frequency-voltage converter coupled to an output of the filter, the receiver further having a muting circuit responsive to an audio signal output of said frequency-voltage converter and blocking the feeding of said audio signal to an audio signal processing section of the receiver unless the receiver is substantially correctly tuned to a broadcast transmission, said muting circuit receiving a correct tuning signal from a correct tuning detector coupled to said frequency-voltage converter, characterized in that the frequency voltage converter is coupled to the voltage controlled oscillator via an amplifier-limiter.

* * * * *